United States Patent
Cheng et al.

(10) Patent No.: US 11,257,934 B2
(45) Date of Patent: Feb. 22, 2022

(54) FIN FIELD-EFFECT TRANSISTORS WITH ENHANCED STRAIN AND REDUCED PARASITIC CAPACITANCE

(71) Applicant: International Business Machines Corporation, Armonk, NY (US)

(72) Inventors: Kangguo Cheng, Schenectady, NY (US); Juntao Li, Cohoes, NY (US); ChoongHyun Lee, Rensselaer, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/752,817

(22) Filed: Jan. 27, 2020

(65) Prior Publication Data

US 2020/0219993 A1 Jul. 9, 2020

Related U.S. Application Data

(62) Division of application No. 16/103,289, filed on Aug. 14, 2018, now Pat. No. 10,644,138.

(51) Int. Cl.
*H01L 29/66* (2006.01)
*H01L 29/08* (2006.01)
(Continued)

(52) U.S. Cl.
CPC .. *H01L 29/66818* (2013.01); *H01L 21/02164* (2013.01); *H01L 21/02236* (2013.01);
(Continued)

(58) Field of Classification Search
CPC ......... H01L 21/02164; H01L 21/02236; H01L 21/2255; H01L 21/28114; H01L 21/823431; H01L 21/823821; H01L 27/0886; H01L 27/0924; H01L 29/0653; H01L 29/0847; H01L 29/165;
(Continued)

(56) References Cited

U.S. PATENT DOCUMENTS 8,450,775 B2 5/2013 Chong et al.
8,729,634 B2 5/2014 Shen et al.
(Continued)

OTHER PUBLICATIONS

List of IBM Patents or Patent Applications Treated as Related, Filed Jan. 27, 2020.

*Primary Examiner* — Allan R Wilson
(74) *Attorney, Agent, or Firm* — Erik Johnson; Ryan, Mason & Lewis, LLP

(57) ABSTRACT

A method of forming a semiconductor structure includes forming a substrate, the substrate having a first portion with a first height and second recessed portions with a second height less than the first height. The method also includes forming embedded source/drain regions disposed over top surfaces of the second recessed portions of the substrate, and forming one or more fins from a portion of the substrate disposed between the embedded source/drain regions, the one or more fins providing channels for fin field-effect transistors (FinFETs). The method further includes forming a gate stack disposed over the one or more fins, and forming inner oxide spacers disposed between the gate stack and the source/drain regions.

20 Claims, 19 Drawing Sheets

(51) Int. Cl.
*H01L 29/06* (2006.01)
*H01L 29/78* (2006.01)
*H01L 21/225* (2006.01)
*H01L 21/02* (2006.01)

(52) U.S. Cl.
CPC ...... *H01L 21/2255* (2013.01); *H01L 29/0653* (2013.01); *H01L 29/0847* (2013.01); *H01L 29/66545* (2013.01); *H01L 29/66553* (2013.01); *H01L 29/7848* (2013.01); *H01L 29/7851* (2013.01)

(58) Field of Classification Search
CPC ......... H01L 29/66545; H01L 29/66553; H01L 29/66818; H01L 29/7848; H01L 29/7851
See application file for complete search history.

(56) References Cited

U.S. PATENT DOCUMENTS

| | | | |
|---|---|---|---|
| 9,196,522 | B2 | 11/2015 | Ching et al. |
| 9,252,245 | B1 | 2/2016 | Akarvardar et al. |
| 9,385,233 | B2 | 7/2016 | Akarvardar et al. |
| 9,716,174 | B2 | 7/2017 | Akarvardar et al. |
| 9,882,052 | B2 | 1/2018 | Holt et al. |
| 2014/0145271 | A1 | 5/2014 | Cheng et al. |
| 2015/0144999 | A1* | 5/2015 | Ching ................. H01L 29/1054 257/190 |
| 2016/0027644 | A1 | 1/2016 | Tsai et al. |
| 2016/0027876 | A1 | 1/2016 | Lee et al. |
| 2016/0035873 | A1 | 2/2016 | Toh et al. |
| 2016/0365426 | A1 | 12/2016 | Ching et al. |
| 2018/0053847 | A1 | 2/2018 | Balakrishnan et al. |
| 2018/0175171 | A1 | 6/2018 | Lo et al. |
| 2018/0286762 | A1* | 10/2018 | Wostyn ............... H01L 29/0673 |
| 2019/0148492 | A1 | 5/2019 | Yong et al. |
| 2019/0165175 | A1 | 5/2019 | More et al. |
| 2021/0083079 | A1* | 3/2021 | Chiang ............ H01L 21/02255 |

* cited by examiner

100

200

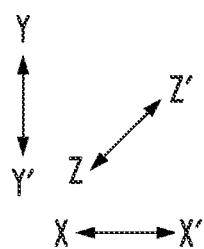
FIG. 3A
300
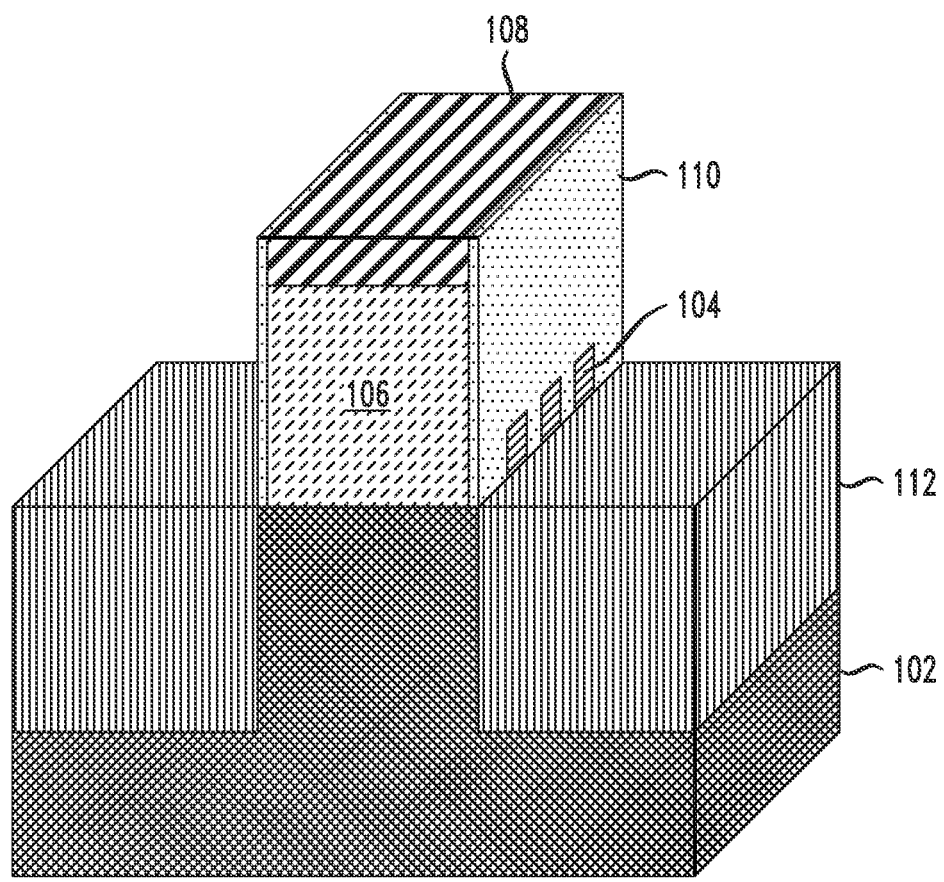

400

500

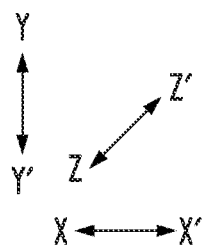
*FIG. 6*
600
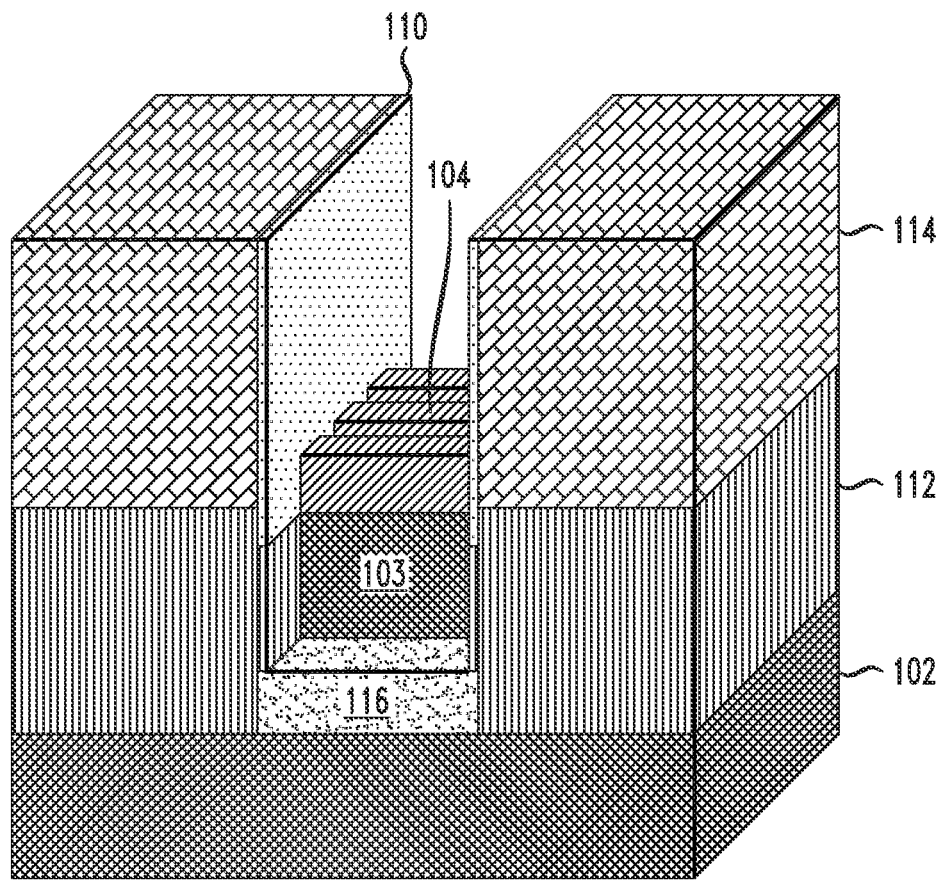

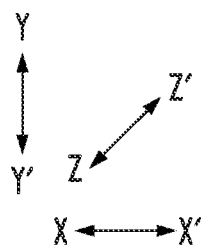
*FIG. 7*
700
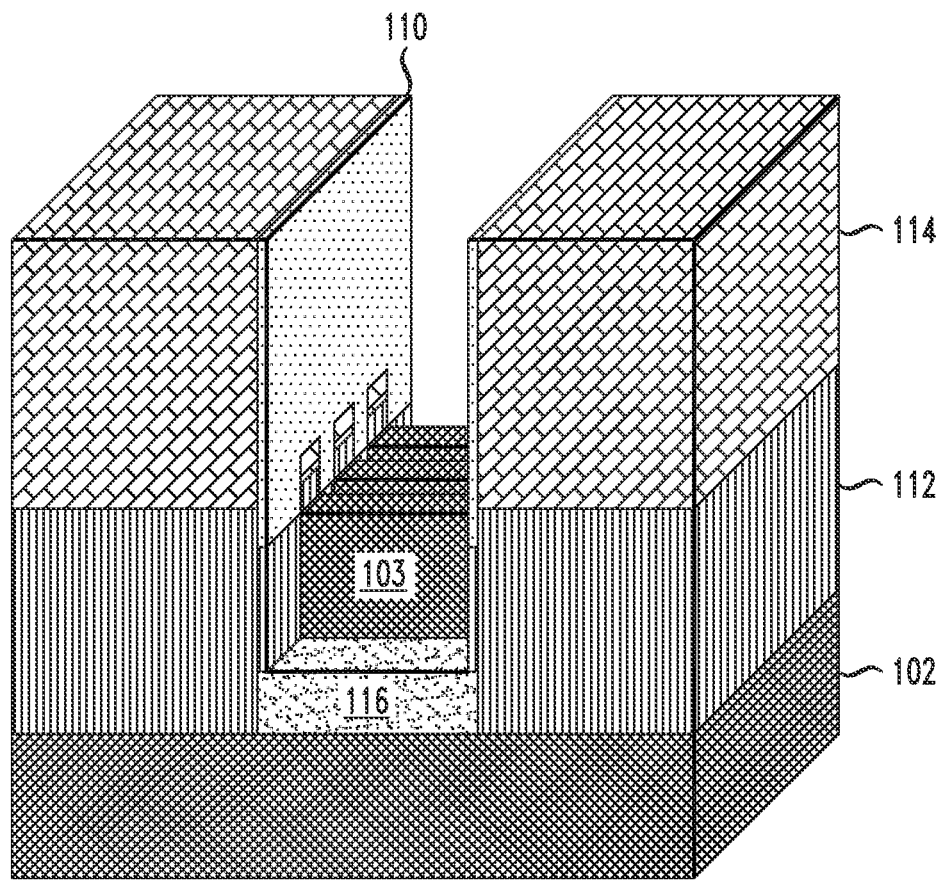

800

850

875

885

900

1000

1100

1175

1200

1300

FIN FIELD-EFFECT TRANSISTORS WITH ENHANCED STRAIN AND REDUCED PARASITIC CAPACITANCE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming fin field-effect transistors with enhanced stain and reduced parasitic capacitance.

In one embodiment, a method of forming a semiconductor structure comprises forming a substrate, the substrate comprising a first portion with a first height and second recessed portions with a second height less than the first height. The method also comprises forming embedded source/drain regions disposed over top surfaces of the second recessed portions of the substrate, and forming one or more fins from a portion of the substrate disposed between the embedded source/drain regions, the one or more fins providing channels for fin field-effect transistors. The method further comprises forming a gate stack disposed over the one or more fins, and forming inner oxide spacers disposed between the gate stack and the source/drain regions.

In another embodiment, a semiconductor structure comprises a substrate, embedded source/drain regions disposed over portions of a top surface of the substrate, one or more fins disposed over the top surface of the substrate between the embedded source/drain regions, the one or more fins providing channels for fin field-effect transistors, a gate stack disposed over the one or more fins, and inner oxide spacers disposed between the gate stack and the source/drain regions.

In another embodiment, an integrated circuit comprises one or more fin field-effect transistors comprising a substrate, embedded source/drain regions disposed over portions of a top surface of the substrate, one or more fins disposed over the top surface of the substrate between the embedded source/drain regions, the one or more fins providing channels for the one or more fin field-effect transistors, a gate stack disposed over the one or more fins, and inner oxide spacers disposed between the gate stack and the source/drain regions.

BRIEF DESCRIPTION OF THE DRAWINGS

FIG. 3A depicts a perspective view of the FIG. 2 structure following recess of the substrate and following formation of source/drain regions, according to an embodiment of the invention.

FIG. 6 depicts a perspective view of the FIG. 5 structure following formation of an isolation layer over the top surface of the substrate between the fins, according to an embodiment of the invention.

FIG. 7 depicts a perspective view of the FIG. 6 structure following removal of the fin hard masks, according to an embodiment of the invention.

DETAILED DESCRIPTION

Figure 1:
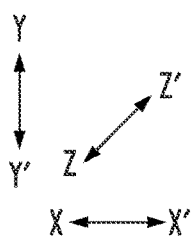
FIG. 1 depicts a perspective view of fin hard masks disposed over a top surface of a substrate, according to an embodiment of the invention.
Figure 1:
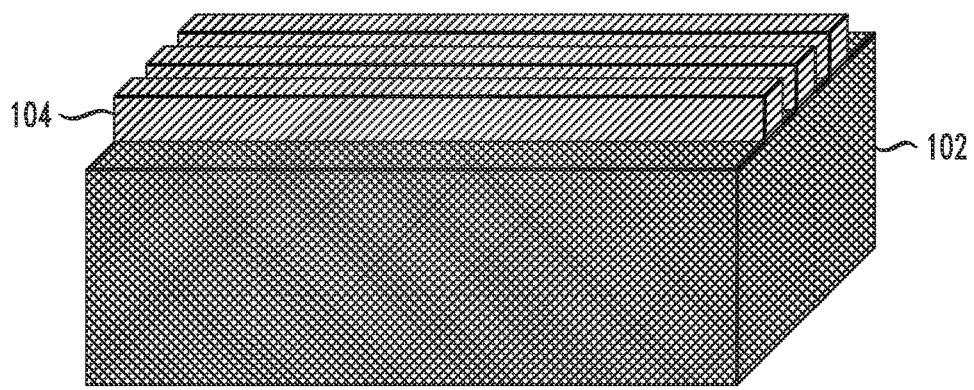

Illustrative embodiments of the invention may be described herein in the context of illustrative methods for forming fin field-effect transistors with enhanced strain and reduced parasitic capacitance, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of majority carriers along a channel that runs past the gate between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques. An important indicator of device performance is carrier mobility. It is difficult to keep carrier mobility high as devices continue to shrink in size.

Current carrying capability, and thus performance of a FET, may be considered proportional to the mobility of a majority carrier in the channel. The mobility of holes (e.g., the majority carriers in a pFET) and the mobility of electrons (e.g., the majority carriers in an nFET) can be enhanced by applying an appropriate stress to the channel. Stress engineering methods may be used to enhance performance, increasing device drive current without increasing device size or capacitance. Application of a tensile stress to nFETs enhances electron mobility, while application of compressive stress to pFETs enhances hole mobility.

Three-dimensional chip fabrication techniques may be used to form fin field-effect transistors (FinFETs). A FinFET is a non-planar FET. The "fin" of the FinFET is a narrow, vertical channel between the source and the drain. The fin is covered by a gate dielectric and bordered on two or three sides by an overlaying gate conductor. The multiple surfaces of the gate allow for more effective suppression of "off-state" leakage current. The multiple surfaces of the gate also allow enhanced current in the "on" state, also known as drive current. These advantages translate to lower power consumption and enhanced device performance.

FinFETs may be used for forming CMOS devices. FinFET fabrication may start with fins formed on a substrate, followed by formation of a gate and epitaxially growth of source/drain regions. Due to the poor quality of epitaxy on wafers with fins, the strain effect by the embedded source/drain (eSD) is greatly reduced in FinFET devices relative to the strain effect by embedded silicon germanium (eSiGe) in bulk planar CMOS devices.

FinFETs may be formed starting with a bulk planar substrate like eSD first, where fins are formed later such as during a replacement metal gate (RMG) process. However, such "fin-late" processes come with the drawback of increasing direct overlap of the gate stack (e.g., high-k gate dielectric and metal gate conductor) with the source/drain regions. The increase of the gate stack and source/drain overlap undesirably increases the parasitic capacitance. Forming an inner spacer between the gate and the source/drain after removal of the dummy gate can reduce the parasitic capacitance. Forming the inner spacer with the exposed fin channel, however, adversely compromises the fin channel quality. Thus, there is a need for techniques for forming improved FinFET structures with enhanced strain (e.g., by eSD) while reliably forming an inner spacer that does not compromise fin channel quality.

Illustrative embodiments provide techniques for forming improved FinFET devices with enhanced strain and reduced parasitic capacitance. The enhanced strain, in some embodiments, is achieved through the use of bulk-like eSD (e.g., eSiGe for pFET and embedded carbon-doped silicon (eSi:C) for nFET). The capacitance reduction, in some embodiments, is achieved by using a low-temperature selective oxidation to form an inner oxide spacer between the gate and source/drain regions.

In some embodiments, the fins are formed of the same material such as silicon (Si) for both nFET and pFET devices. In other embodiments, nFET and pFET fins may have different materials, such as Si for nFET and silicon germanium (SiGe) for pFET. Further, SiGe fins may be formed with varying concentrations of germanium (Ge). Different concentrations of Ge or Ge % in SiGe fins may be used to form devices with different threshold voltages. In addition, multiple FinFET devices may share a common gate stack (e.g., interlayer (IL), high-k gate dielectric (HK) and work function metal (WFM) gate conductor).

Illustrative processes for forming FinFETs with enhanced strain and reduced parasitic capacitance will now be described with respect to FIGS. 1-13.

FIG. 1 shows a perspective view 100 a substrate 102 having fin hard masks 104 patterned over a top surface thereof. The substrate 102 may comprise bulk silicon (Si), or another suitable substrate material, e.g., a bulk semiconductor, a semiconductor-on-insulator (SOI) substrate, etc. In some embodiments, the substrate 102 includes a silicon-containing material. Illustrative examples of Si-containing materials suitable for the substrate 102 can include, but are not limited to, Si, silicon germanium (SiGe), carbon doped silicon germanium (SiGe:C), silicon germanium carbide (SiGeC), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc. In some embodiments, epitaxy growth can be performed to form the substrate 102 with different materials. For example, SiGe epitaxy can be performed to grow SiGe on a silicon wafer.

The fin hard masks 104, as shown, are patterned over the top surface of the substrate 102. The fin hard masks 104 define where fins will be formed from a portion of the substrate 102 as will be described in further detail below with respect to FIG. 5. The fin hard masks 104 may be formed of silicon oxycarbide (SiOC) or another suitable material. In some embodiments, multiple layers of materials are used as fin hard masks 104. The fin hard masks 104 can be patterned by lithography followed by etch processing (e.g., reactive-ion etching (RIE)). Other suitable techniques, such as sidewall image transfer (SIT), self-aligned double patterning (SADP), self-aligned multiple patterning (SAMP), self-aligned quadruple patterning (SAQP), etc. can be used.

Each of the fin hard masks 104 may have a length (in direction X-X') may have a width ranging from 100 nanometers (nm) to 1000 nm. Each of the fin hard masks 104 may have a width (in direction Z-Z') ranging from 4 nm to 12 nm, and a height (in direction Y-Y') ranging from 20 nm to 60 nm.

Although not shown in FIG. 1, doped wells may be formed in the substrate 102 by implantation and anneal processes.

Figure 2:
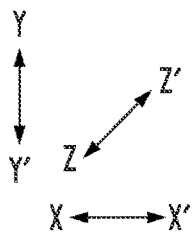
FIG. 2 depicts a perspective view of the FIG. 1 structure following formation of a dummy gate, dummy gate capping layer and sidewall spacers, according to an embodiment of the invention.
Figure 2:
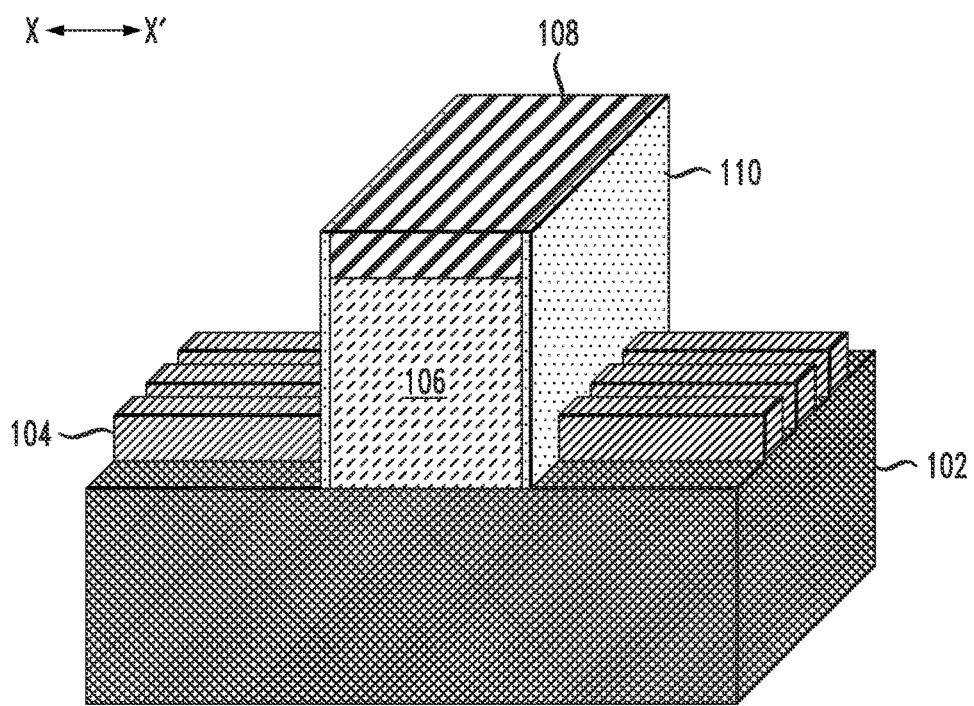

FIG. 2 shows a perspective view 200 of the FIG. 1 structure following formation of a dummy gate 106, a dummy gate capping layer 108 and sidewall spacers 110.

The dummy gate 106 may be formed using deposition (e.g., chemical vapor deposition (CVD)) processing. The dummy gate 106 may be formed of amorphous silicon (a-Si), polycrystalline silicon (polysilicon) or another suitable material. The dummy gate may further comprise a dummy oxide layer (e.g., $SiO_2$) around the fin hard masks 104 before the deposition of aSi or polysilicon. The dummy gate 106 may have a width (in direction X-X') in the range of 10 nm to 60 nm, and a height (in direction Y-Y') in the range of 30 nm to 60 nm. The depth (in direction Z-Z') of the dummy gate 106 in the range of 50 nm to 1000 nm.

The dummy gate capping layer 108 may be formed using deposition (e.g., chemical vapor deposition (CVD)) processing. The dummy gate capping layer 108 may be formed of silicon nitride (SiN) or another suitable material. The dummy gate 106 and dummy gate capping layer 108 may be formed by first depositing the materials for such layers, followed by patterning such materials to form the dummy gate structure illustrating in FIG. 2. Any suitable patterning technique may be used, including lithography followed by etching (e.g., RIE), SIT, SADP, SAMP, SAQP, etc.

The sidewalls spacers 110 may be formed using deposition followed by directional etch (e.g., RIE) processing. The sidewall spacers 110 may be formed of silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), another suitable material, or any suitable combination of such materials. The sidewalls spacers 110 may have a width (in direction X-X') ranging from 3 nm to 10 nm. The height (in direction Y-Y') of the sidewall spacers 110 may match that of a top surface of the dummy gate capping layer 108. The depth (in direction Z-Z') of the sidewall spacers 110 may match that of the underlying substrate 102.

Figure 3B:
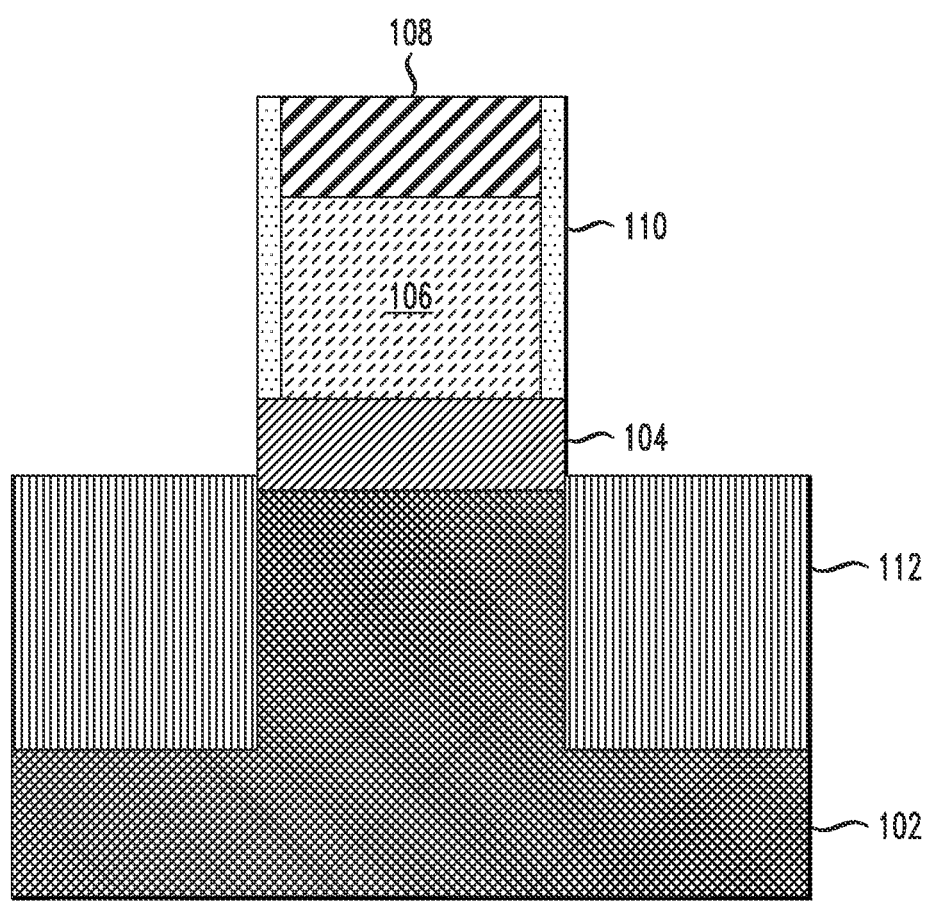
FIG. 3B depicts a cross-sectional view of the FIG. 3A structure following the recess of the substrate and formation of the source/drain regions, according to an embodiment of the invention.

FIG. 3A shows a perspective view 300 of the FIG. 2 structure following recess, using the dummy gate capping layer 108 and sidewall spacers 110 as a mask, to remove exposed portions of the fin hard masks 104 and to recess the substrate 102. The perspective view 300 further illustrates the FIG. 2 structure following formation of source/drain regions 112. FIG. 3B shows a cross-sectional view 350 of the FIG. 3A structure, taken across the substrate (in direction X-X').

As illustrated in FIGS. 3A and 3B, the portions of the hard masks 104 not covered by the dummy gate capping layer 108 and sidewall spacers 110 are removed. The fin hard masks 104, however, remain below the dummy gate 106 as shown in FIG. 3B. The substrate 102 is recessed (e.g., to a depth in direction Y-Y' in the range of 30 nm to 60 nm). As noted below, the dimensions for the depth of recess of the substrate 102, and other dimensions provided herein are by example only, and embodiments are not limited to the exact ranges provided. Other dimensions may be used as desired for a particular application.

The source/drain regions 112 are then epitaxially grown. Unlike a conventional FinFET fabrication, in some embodiments the epitaxy is grown in a bulk silicon trench (e.g., with no fins). Therefore, a better epitaxy quality and thus stronger strain can be achieved. The improved epitaxy quality is due, in part, as the epitaxial growth is from the bottom and sidewalls of the recessed substrate 102 as opposed to structures where fins are already formed and an oxide is disposed on the sidewalls of the fins during the epitaxial growth of the source/drain regions.

For pFET FinFETs, the embedded source/drain epitaxy for forming source/drain regions 112 may utilize in-situ boron doped SiGe. For nFET FinFETs, the embedded source/drain epitaxy for forming source/drain regions 112 may utilize in-situ phosphorus doped Si:C. It should be appreciated, however, that other dopants may be used in other embodiments during epitaxial growth of the top source/drain regions 112. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

In some embodiments, the epitaxial growth process for forming source/drain regions 112 comprises in-situ doping (e.g., where dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

Figure 4:
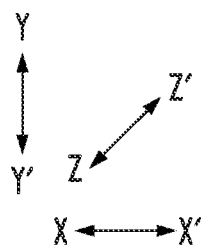
FIG. 4 depicts a perspective view of the FIG. 3A structure following formation of an interlevel dielectric layer and following removal of the dummy gate, according to an embodiment of the invention.
Figure 4:
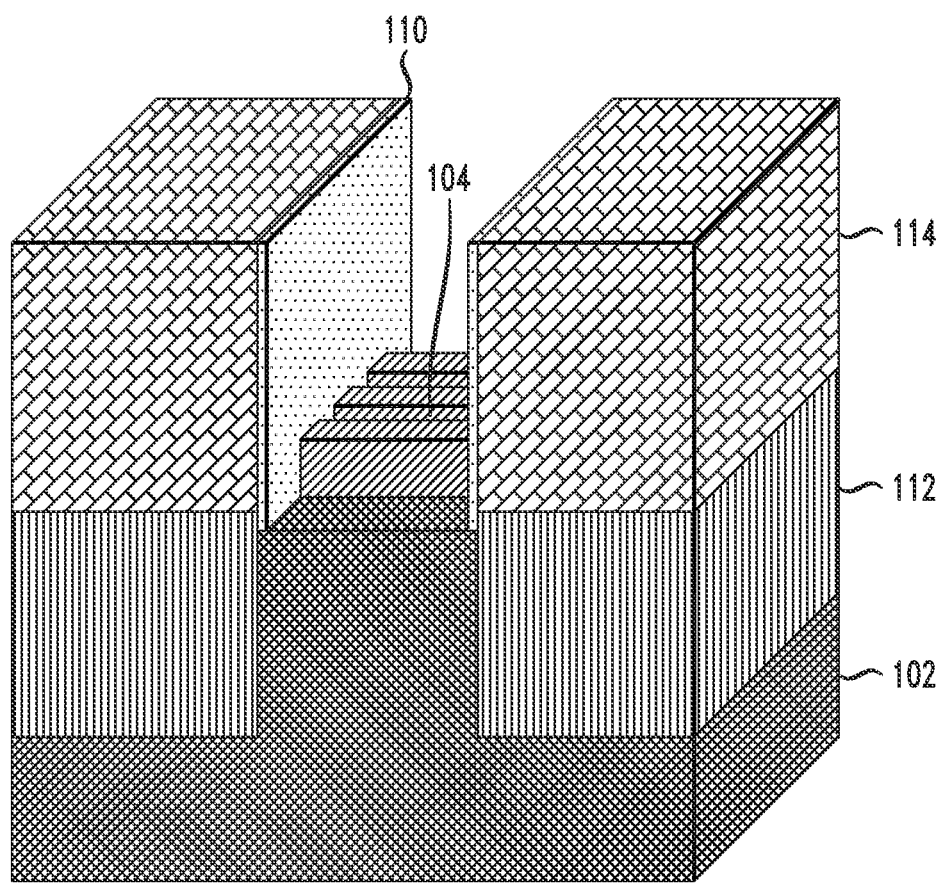

FIG. 4 depicts a perspective view 400 of the FIG. 3 structure following formation of an interlevel dielectric (ILD) layer 114, and following removal of the dummy gate capping layer 108 and dummy gate 106.

The ILD layer 114 may be formed through deposition and planarization using chemical mechanical polishing (CMP) or another suitable technique, such that a top surface of the ILD layer 114 is substantially coplanar with the top surfaces of the sidewalls spacers 110. Although not shown in FIG. 4, a capping layer may be formed on top of the ILD layer 114 to protect the ILD layer 114 during later processing steps described in further detail below. To form the capping layer, the ILD layer 114 may be recessed followed by deposition and planarization of the capping material (e.g., SiOC or another suitable material).

The dummy gate capping layer 108 and dummy gate 106 are removed using any suitable processing, thus exposing remaining portions of the fin hard masks 104 as illustrated in FIG. 4. For example, RIE can be used to remove dummy gate capping layer 108. Wet etch (e.g., ammonia etch) and/or dry etch (e.g., plasma silicon etch) can be used to remove the aSi or polysilicon dummy gate 106. If dummy gate oxide (e.g., silicon oxide) is formed around the fin hard masks 104 prior to deposition of the dummy gate 106, the dummy gate oxide can be removed by wet etch (e.g., hydrogen fluoride acid) or dry etch (e.g., chemical oxide removal).

Figure 5:
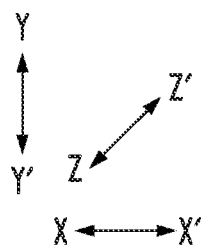
FIG. 5 depicts a perspective view of the FIG. 4 structure following formation of fins using the fin hard mask, according to an embodiment of the invention.
Figure 5:
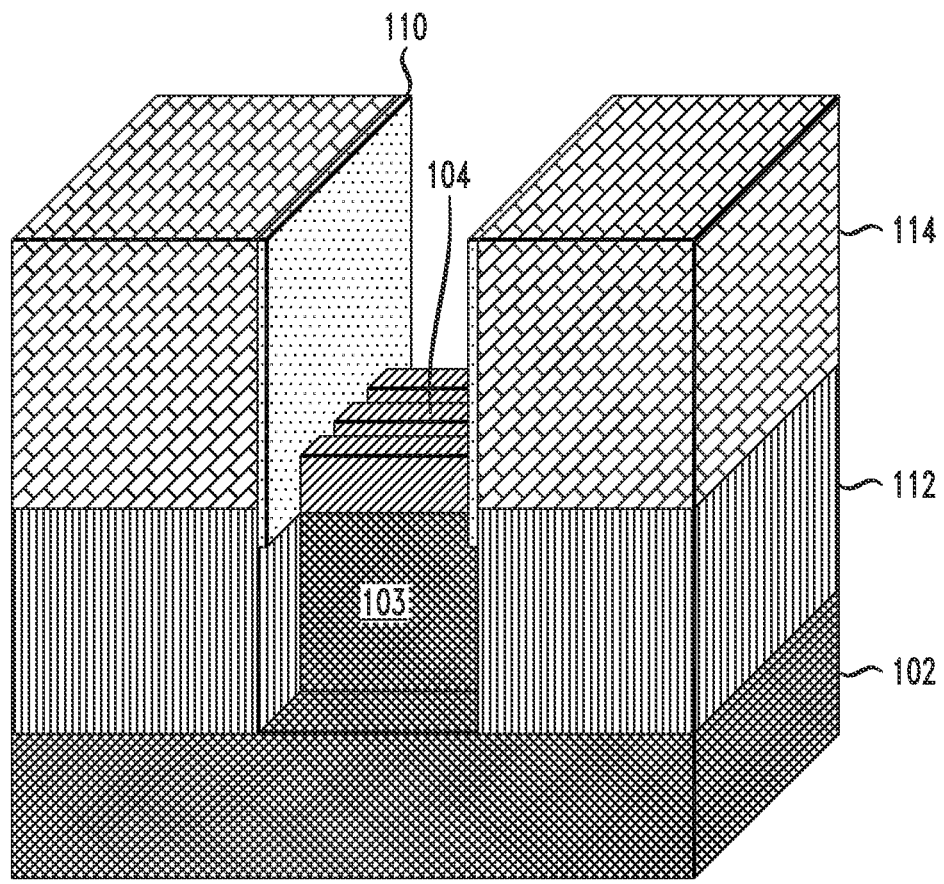

FIG. 5 shows a perspective view 500 of the FIG. 4 structure following formation of fins 103 using the fin hard masks 104 disposed over the top surface of the substrate 102. The patterning of the fin hard masks 104 is transferred to the substrate 102 to form the fins 103 (e.g., channels for the resulting FinFET structures). A directional etch, such as directional reactive-ion etching (RIE), is used to transfer the patterning of the fin hard masks 104 to the substrate 102 to form fins 103. Each of the fins 103 may have a height (in direction Y-Y') in the range of 30 nm to 100 nm, and a width (in direction Z-Z') that matches that of the fin hard masks 104. The lengths of the fins 103 (in direction X-X') extend between the source/drain regions 112 as illustrated.

Since the source/drain regions 112 are covered by the ILD layer 114 during the directional etch to form the fins 103, the original high quality eSD remain. The strain to the fins 103 is thus enhanced because, after the fin ME, there is less material (e.g., silicon) in the channels or fins 103 to be strained.

To complete fabrication of FinFET structures, a gate stack is formed. It is, however, undesired to form the gate dielectric of the gate stack (e.g., a high-k dielectric) on the exposed sidewalls of the source/drain regions 112 as this will lead to a high parasitic capacitance. In addition, formation of the gate dielectric on the top surface of the substrate 102 between and surrounding the fins 103 should be avoided as this will also lead to a high parasitic capacitance. Processing for reducing such potential parasitic capacitances will now be described with respect to FIGS. 6-13.

FIG. 6 shows a perspective view 600 of the FIG. 5 structure following formation of an isolation layer 116 over the exposed portions of the top surface of the substrate 102 between the fins 103. The isolation layer 116 may be formed by deposition and recess. The isolation layer 116 may be formed of an oxide such as silicon oxide. The isolation layer 116 may have a height (in direction Y-Y') ranging from 30 nm to 60 nm. The isolation layer 116 advantageously reduces parasitic capacitance between the substrate 102 and the gate formed in later processing described in further detail below.

FIG. 7 shows a perspective view 700 of the FIG. 6 structure following removal of the fin hard masks 104. The fin hard masks 104 are removed selective to the sidewall spacers 110, such as using selective dry etch processing.

Figure 8A:
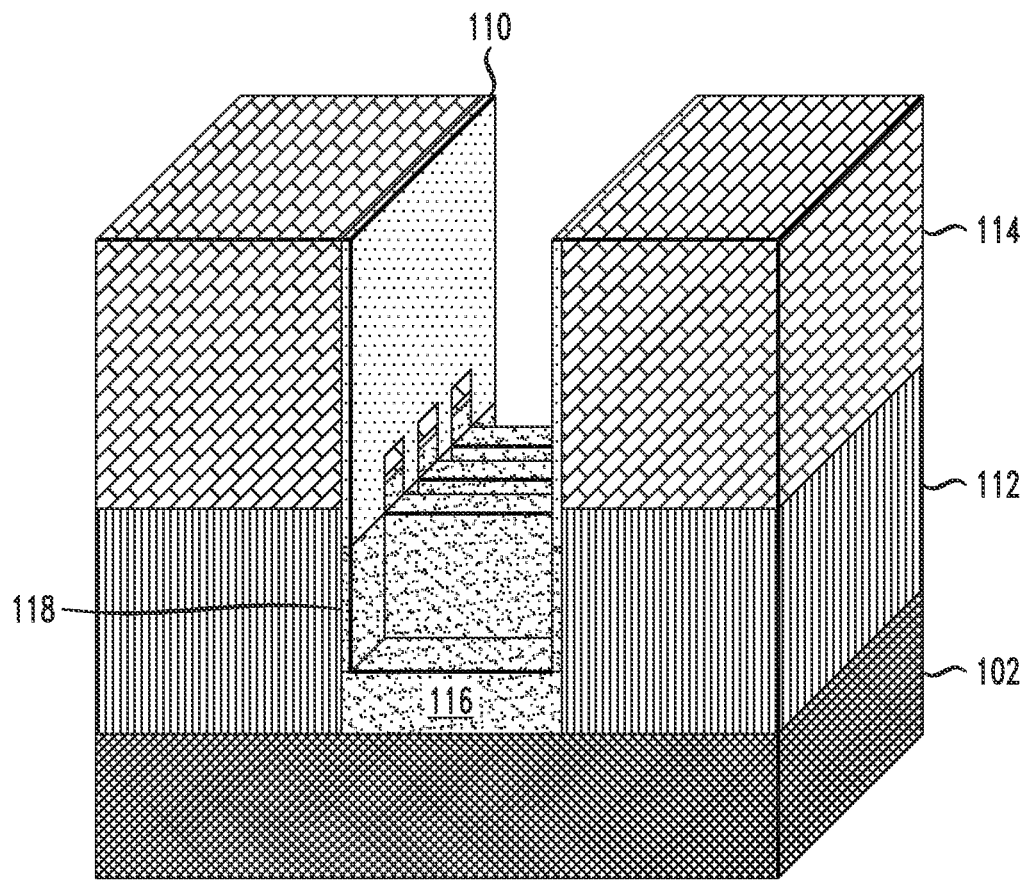
FIG. 8A depicts a perspective view of the FIG. 7 structure following formation of an oxide on exposed surfaces of the source/drain regions and the sidewalls of the fins, according to an embodiment of the invention.
Figure 8B:
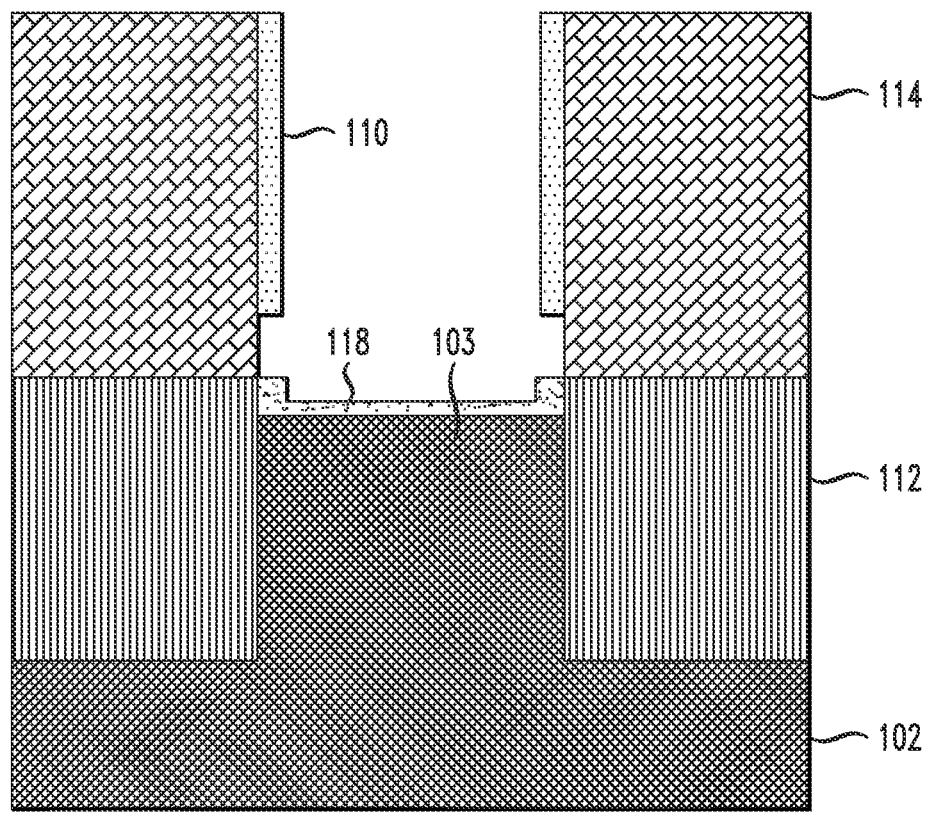
FIG. 8B depicts a first cross-sectional view of the FIG. 8A structure, taken across one of the fins, following formation of the oxide on the exposed surfaces of the source/drain regions and the sidewalls of the fins, according to an embodiment of the invention.
Figure 8C:
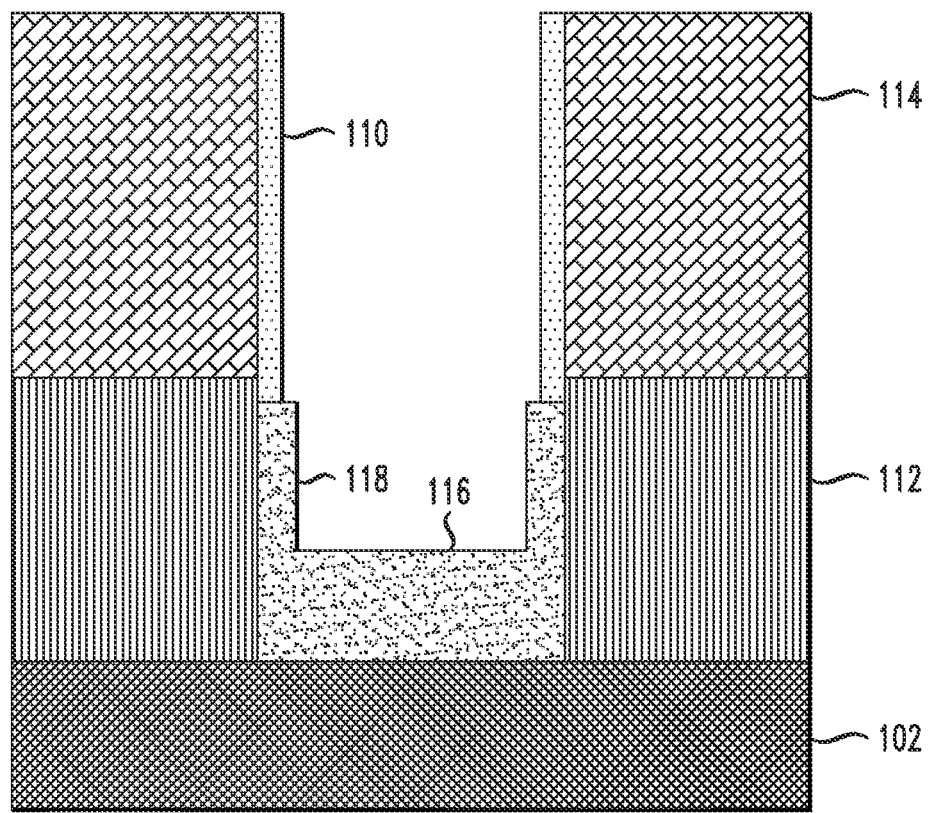
FIG. 8C depicts a second cross-sectional view of the FIG. 8A structure, taken between one of the fins, following formation of the oxide on the exposed surfaces of the source/drain regions and the sidewalls of the fins, according to an embodiment of the invention.
Figure 8D:
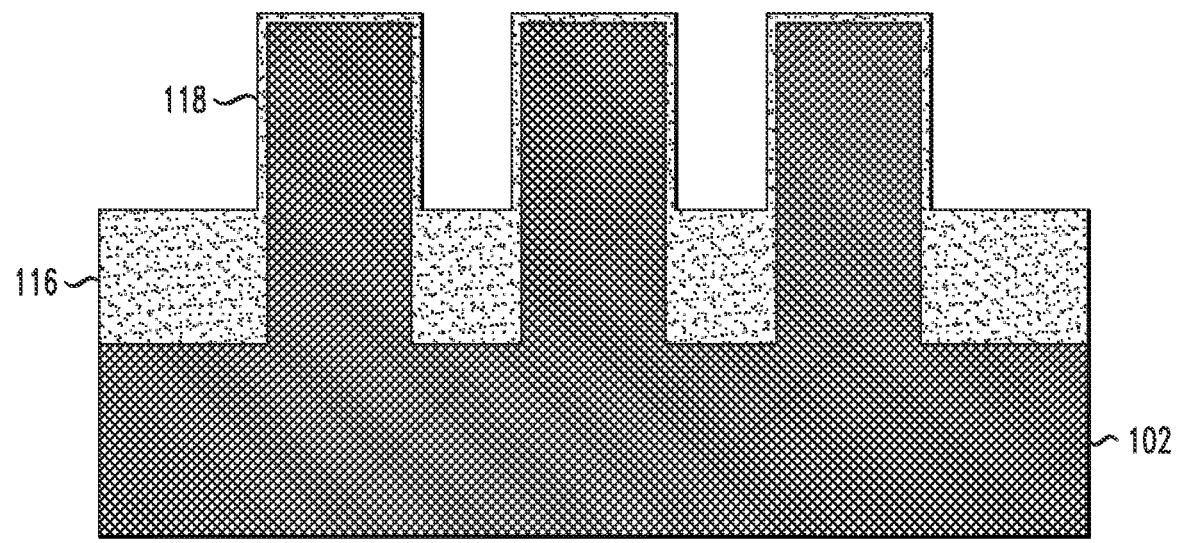
FIG. 8D depicts a third cross-sectional view of the FIG. 8A structure, taken across the fins, following formation of the oxide on the exposed surfaces of the source/drain regions and the sidewalls of the fins, according to an embodiment of the invention.

FIG. 8A shows a perspective view 800 of the FIG. 7 structure following formation of an oxide layer 118 on exposed surfaces of the source/drain regions 112 and on sidewalls and top surfaces of the fins 103. FIG. 8B shows a first cross-sectional view 850 of the FIG. 8A structure, taken across or parallel to one of the fins 103. FIG. 8C shows a second cross sectional view 875 of the FIG. 8A structure, taken parallel to the fins 103, but in a region between two of the fins 103. FIG. 8D shows a third cross-sectional view 885 of the FIG. 8A structure, taken across or perpendicular to the fins 103.

The oxide layer 118 may be formed using a low temperature (e.g., at temperatures below 700° C.) oxidation process such that the oxide layer 118 is formed on the exposed sidewalls of the source/drain regions 112, and on sidewalls and top surfaces of the fins 103. The fins 103, which may be formed of undoped Si, have a much lower oxidation rate than the heavily-doped source/drain regions 112, which exhibit doping enhanced oxidation. As the oxidation rate is a function of the doping, the oxide layer 118 adjacent the sidewalls of the source/drain regions 114 is thicker than the oxide layer 118 adjacent sidewalls and on the top surfaces of the fins 103. For example, the oxidation rate for the source/drain regions 112 relative to the fins 103 can be greater than 4:1. Thus, the oxide layer 118 adjacent the sidewalls of the source/drain regions 114 may have a thickness in the range of 6 nm to 12 nm, while the oxide layer 118 on the sidewalls and top surfaces of the fins 103 may have a thickness in the range of 1 nm to 3 nm. The oxidation process can be a furnace oxidation with oxygen, a furnace oxidation with water steam, a furnace oxidation with a mix of hydrogen and oxygen, a plasma oxidation, a rapid thermal oxidation, a laser-assisted oxidation, etc. The oxidation temperature and duration can be tuned to achieve desired oxide thicknesses and oxidation rate ratio. In some embodiments, the oxidation is performed at 600° C. for 5 minutes in an environment containing water stream (wet oxidation).

Figure 9:
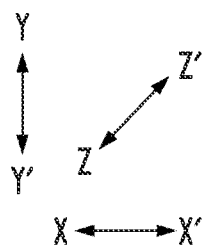
FIG. 9 depicts a perspective view of the FIG. 8 structure following removal of the oxide on the sidewalls of the fins, according to an embodiment of the invention.
Figure 9:
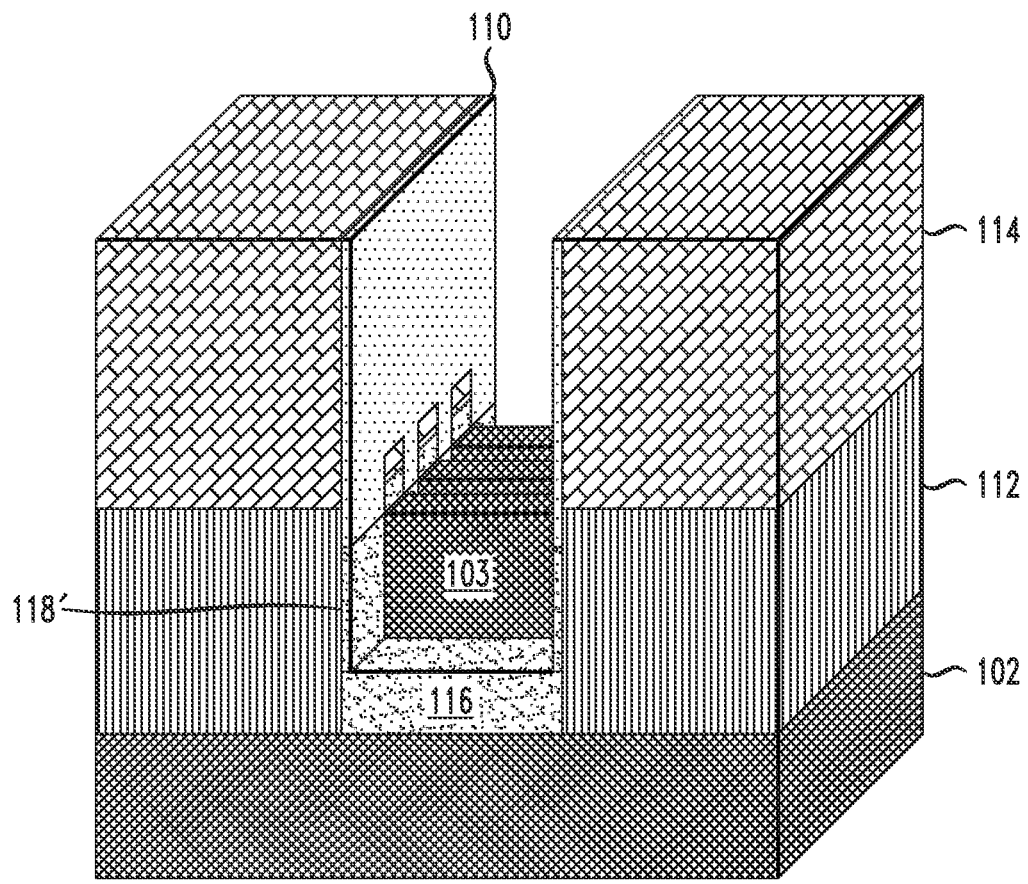

FIG. 9 shows a perspective view 900 of the FIG. 8 structure following removal of portions of the oxide layer 118 formed on the sidewalls and top surfaces of the fins 103. This may be achieved by etching in hydrofluoric acid (HF) or by chemical oxidation removal (COR), which will completely remove portions of the oxide layer 118 disposed on the sidewalls and top surface of the fins 103 while also thinning portions of the oxide layer 118 formed adjacent the sidewalls of the source/drain regions 112. The remaining portions of the oxide layer 118 provide inner oxide spacers 118' for the resulting structure as illustrated. The etching of the oxide layer 118 may be referred to as a high-k pre-clean before formation of the gate dielectric over the fins 103.

Figure 10A:
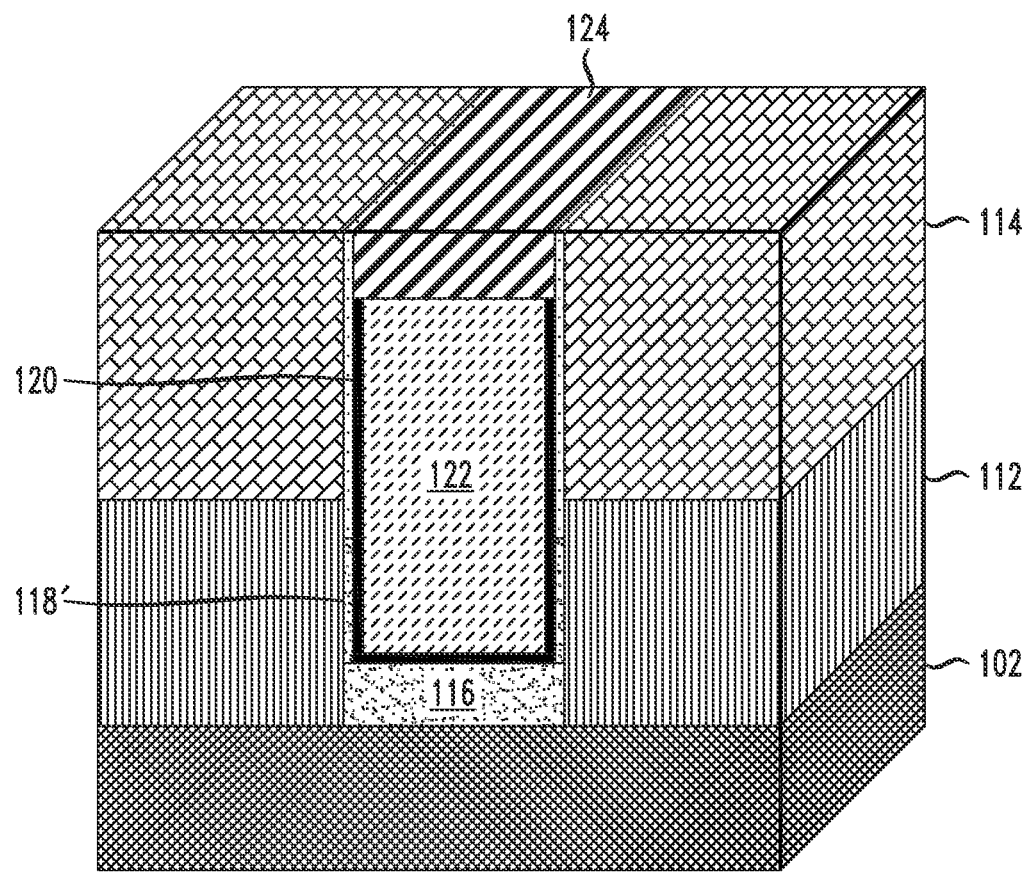
FIG. 10A depicts a perspective view of the FIG. 9 structure following formation of a gate dielectric, a gate conductor and a gate capping layer, according to an embodiment of the invention.
Figure 10B:
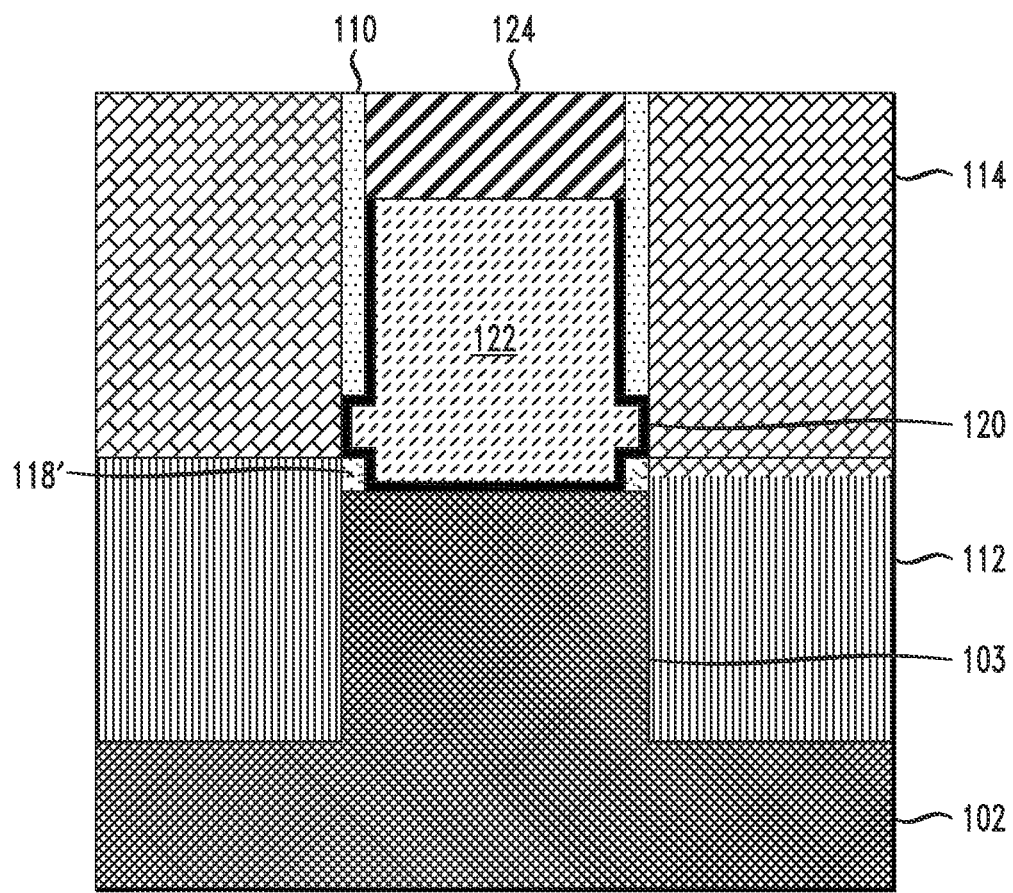
FIG. 10B depicts a cross-sectional view of the FIG. 10A structure, taken along one of the fins, following formation of the gate dielectric, the gate conductor and the gate capping layer, according to an embodiment of the invention.

FIG. 10A shows a perspective view 1000 of the FIG. 9 structure following formation of a gate dielectric 120, a gate conductor 122, and a gate capping layer 124. FIG. 10B shows a cross-sectional view 1050 of the FIG. 10A structure, taken along or parallel to one of the fins 103, following formation of the gate dielectric 120, the gate conductor 122 and the gate capping layer 124. As mentioned above, during the high-k preclean, there is partial loss or thinning of the oxide layer 118 formed adjacent the sidewalls of the source/drain regions 112. The remaining portions of the oxide layer 118, however, provide inner oxide spacers 118' that act as an insulation layer between the gate and the source/drain regions 112.

The gate dielectric 120 can comprise any suitable dielectric material, including but not limited to silicon oxide (SiO), silicon nitride (SiN), silicon oxynitride (SiON), high-k materials, or any combination of these materials. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k may further include dopants such as lanthanum (La), aluminum (Al), magnesium (Mg), etc. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

The gate conductor 122 may be formed of any suitable conducting material, including but not limited to, doped polycrystalline or amorphous silicon, germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g., titanium aluminide (Ti$_3$Al), zirconium aluminide (ZrAl), etc.), tantalum carbide (TaC$_x$), tantalum magnesium carbide (TaMgC), carbon nanotube, conductive carbon, graphene, or any suitable combination of these materials. The conductive material may further comprise dopants that are incorporated during or after deposition.

In some embodiments, the gate may further comprise a work function setting layer between the gate dielectric and gate conductor. The work function setting layer can be a work function metal (WFM). The WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both the gate conductor 122 and the work function setting layer or WFM. The gate conductor 122 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The gate capping layer 124 may be formed of a nitride such as silicon nitride (SiN), or another suitable material such as silicon carbide (SiC). The gate capping layer 124 may have a height (in direction Y-Y') ranging from 15 nm to 40 nm.

Figure 11A:
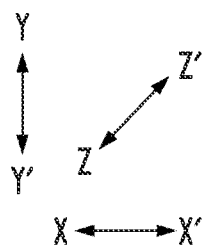
FIG. 11A depicts a perspective view of the FIG. 7 structure following coating of an oxide layer, according to an embodiment of the invention.
Figure 11A:
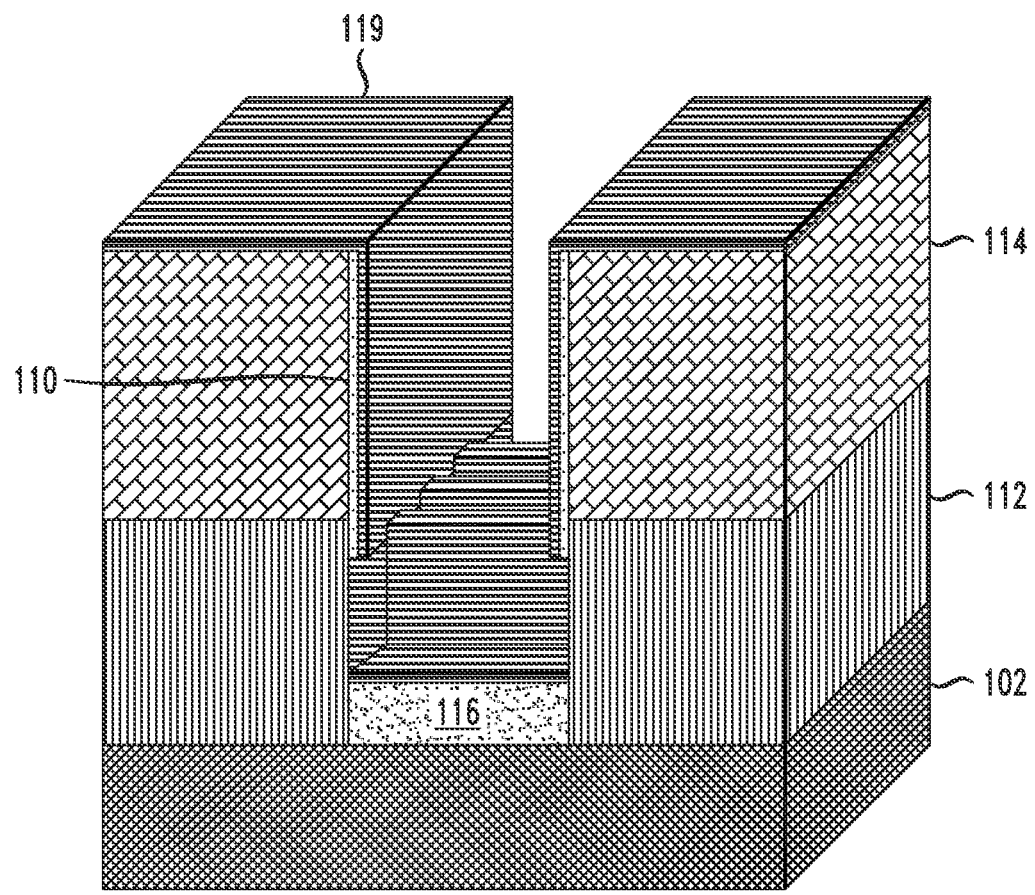
Figure 11B:
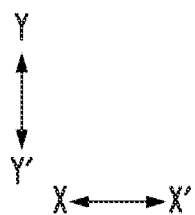
FIG. 11B depicts a cross-sectional view of the FIG. 11A structure, taken along one of the fins, following coating of the oxide layer, according to an embodiment of the invention.
Figure 11B:
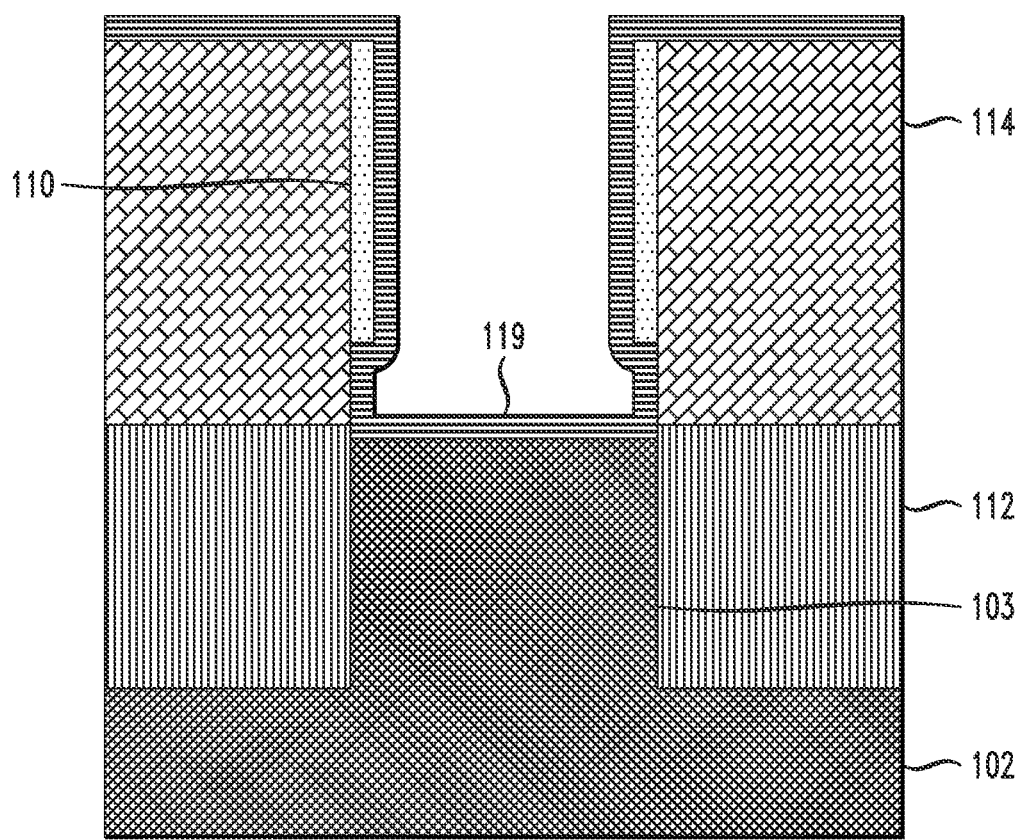
Figure 11C:
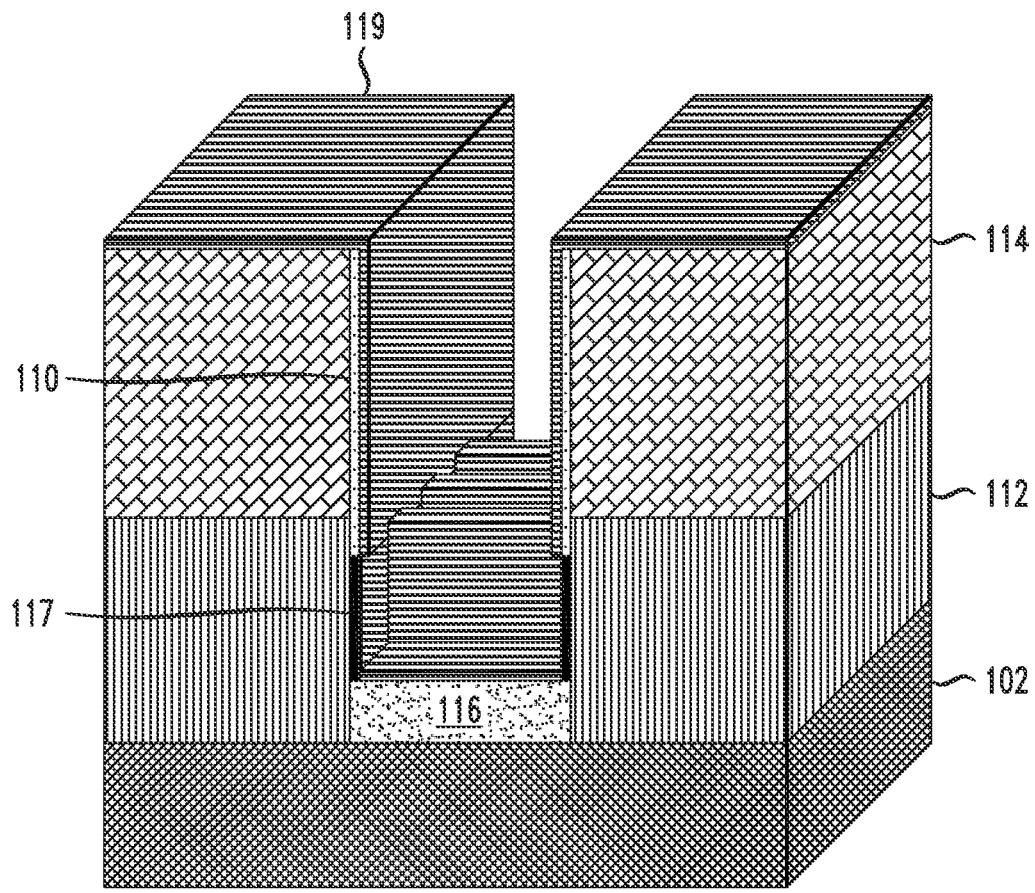
FIG. 11C depicts a perspective view of the FIG. 7 structure following formation of a buffer liner and following coating of the oxide layer, according to an embodiment of the invention.
Figure 12:
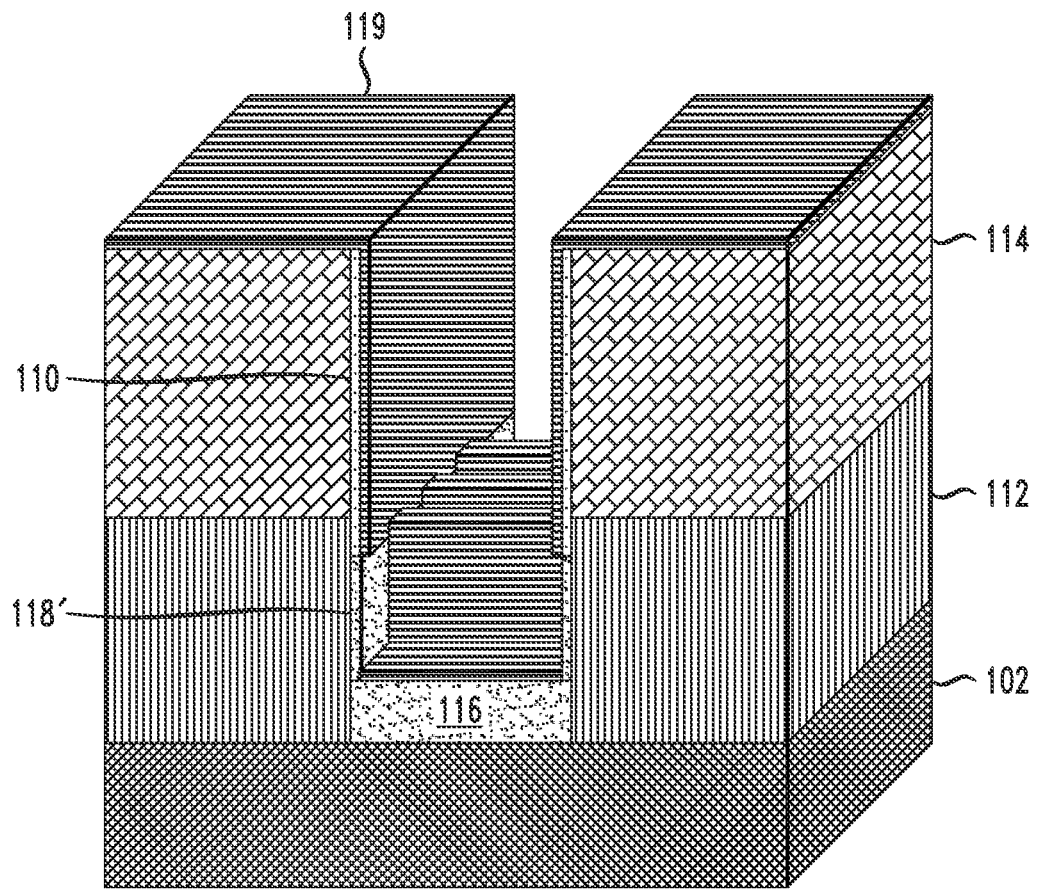
FIG. 12 depicts a perspective view of the FIG. 11A structure following an anneal to form an inner oxide spacer from portions of the oxide layer, according to an embodiment of the invention.
Figure 13:
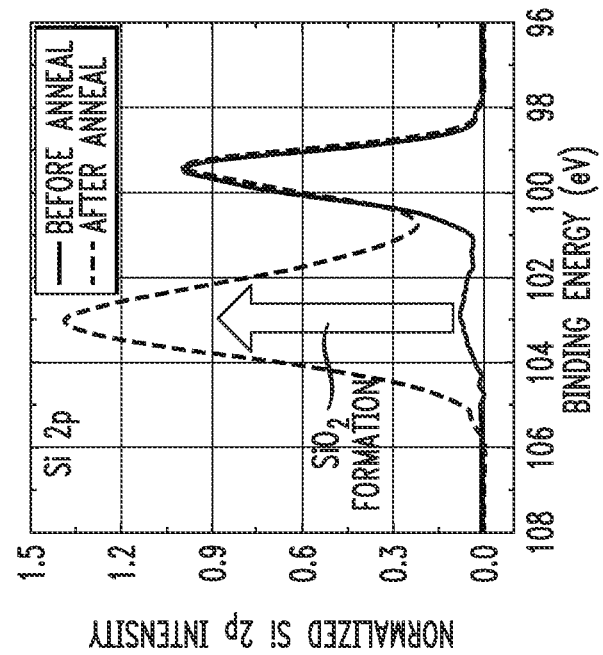
FIG. 13 depicts selective formation of silicon dioxide from a germanium oxide layer disposed on a silicon germanium layer, according to an embodiment of the invention.
Figure 13:
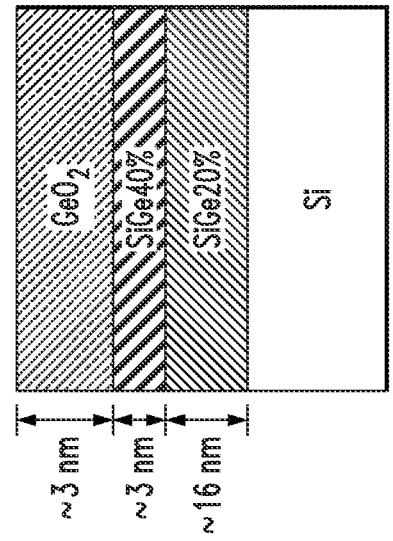
Figure 13:
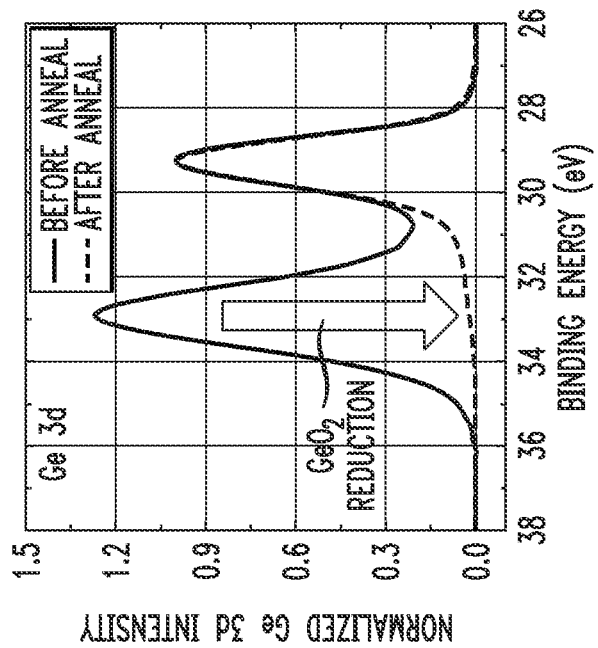
Figure 13:
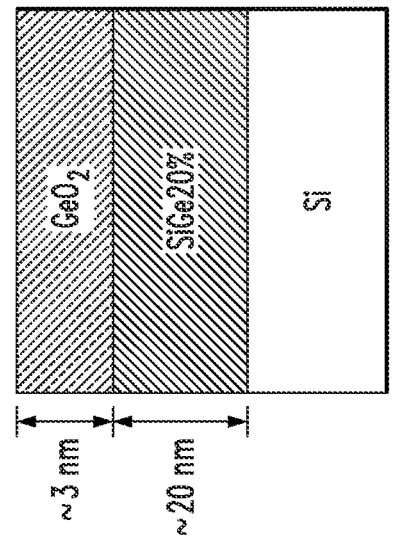

FIGS. 11-13 illustrate another process for forming the inner oxide spacers 118'. In the embodiment of FIGS. 11-13, the inner oxide spacers 118' are formed by a chemical reaction of germanium oxide (GeO$_2$) with SiGe. pFET structures may utilize SiGe as the material for the source/drain regions 112. nFET structures, however, may utilize a Si:C eSD. For structures that do not utilize SiGe as the material for the source/drain regions 112 (e.g., for nFETs), a SiGe buffer liner is formed on the sidewalls of the source/drain regions 112 prior to formation of the GeO$_2$ as described below. This SiGe buffer liner is thin enough (e.g., approximately 3 nm) so that it does not compromise the tensile strain from the much thicker Si:C eSD. On the other hand, the SiGe buffer liner serves as a catalyst between the GeO$_2$ and the eSD to form the inner oxide spacers 118' (e.g., which may be formed of SiO$_2$) as described in further detail below with respect to FIG. 13.

FIG. 11A shows a perspective view 1100 of the FIG. 7 structure, following deposition or coating of an oxide layer 119 (e.g., formed of GeO$_2$). FIG. 11B shows a cross-sectional view 1150 of the FIG. 11A structure, taken along or parallel to one of the fins 103 following deposition of the oxide layer 119.

The oxide layer 119 may be deposited using atomic layer deposition (ALD) or another suitable process such as chemical vapor deposition (CVD). The exposed sidewalls of the source/drain regions 112 are thus coated with the oxide layer 119. The oxide layer 119 may have a thickness in the range of 4 nm to 8 nm.

As shown in the perspective view 1175 of FIG. 11C, a SiGe buffer liner 117 can be grown on the source/drain trenches before growing other portions of the embedded source/drain. This SiGe buffer liner 117 may be formed using epitaxy processing, and may have a thickness in the range of 2 nm to 5 nm.

FIG. 12 shows a perspective view 1200 of the FIG. 11A structure following an anneal that forms the inner oxide spacers 118' from portions of the oxide layer 119 and the underlying source/drain regions 112 (or a SiGe buffer liner 117 disposed between the source/drain regions 112 and the oxide layer 119). The anneal may comprise a spike anneal such as an anneal in nitrogen gas (N$_2$) at 700° C. for a duration of 30 seconds. The anneal converts the portions of the oxide layer 119 disposed on sidewalls of the source/drain regions 112 to an oxide such as SiO$_2$.

Following the anneal of FIG. 12, the remaining portions of the oxide layer 119 (e.g., the unreacted GeO$_2$) may be removed, such as in water (H$_2$O). Processing may then continue for forming the gate stack in a manner similar to that described above with respect to FIGS. 9 and 10.

FIG. 13 depicts selective formation 1300 of SiO$_2$ on a SiGe layer. For example, a first multi-layer stack 1301 (comprising Si, SiGe (with 20% Ge) with approximate thickness of 20 nm and GeO$_2$ with approximate thickness of 3 nm) is subject to an anneal (e.g., a spike anneal in N$_2$ at 700° C.), which forms the second stack 1303 (comprising Si, SiGe (with 20% Ge) with approximate thickness of 16 nm, SiGe (with 40% Ge) with approximate thickness of 3 nm, and SiO$_2$ with approximate thickness of 3 nm). Ambient oxygen is not required for SiO$_2$ formation. The Si in the SiGe layer is selectively oxidized due to the lower Gibbs free energy. The reaction is: $Si+Ge+2GeO_2 \rightarrow Ge$ (remained)$+2GeO$ (volatile species)$+SiO_2$ (oxide formation).

In some embodiments, a method of forming a semiconductor structure comprises forming a substrate, the substrate comprising a first portion with a first height and second recessed portions with a second height less than the first height. The method also comprises forming embedded source/drain regions disposed over top surfaces of the second recessed portions of the substrate, and forming one or more fins from a portion of the substrate disposed between the embedded source/drain regions, the one or more fins providing channels for FinFETs. The method further comprises forming a gate stack disposed over the one or more fins, and forming inner oxide spacers disposed between the gate stack and the source/drain regions.

Forming the inner oxide spacers may comprise performing an oxidation to form an oxide layer on sidewalls of the source/drain regions and surfaces of the one or more fins, where an oxidation rate of the source/drain regions is greater than an oxidation rate of the one or more fins, and etching the oxide layer to remove portions of the oxide layer from the surface of the one or more fins and to thin portions of the oxide layer disposed on sidewalls of the source/drain regions, where the thinned portions of the oxide layer disposed on the sidewalls of the source/drain regions comprise the inner oxide spacers.

The FinFETs may comprise pFETs and the embedded source/drain regions comprise SiGe. Forming the source/drain regions may comprise epitaxial growth using in-situ boron doped SiGe. In such cases, forming the inner oxide spacers may comprise depositing a $GeO_2$ layer on sidewalls of the source/drain regions and surfaces of the one or more fins, performing an anneal to form the inner oxide spacers from portions of the $GeO_2$ layer and the source/drain regions, and removing unreacted portions of the $GeO_2$ layer from the surfaces of the one or more fins.

The FinFETs may alternately comprise nFETs and the embedded source/drain regions comprise Si:C. Forming the source/drain regions comprises epitaxial growth using in-situ phosphorus doped Si:C. In such cases, forming the inner oxide spacers may comprise depositing a SiGe buffer liner on sidewalls of the source/drain regions, depositing a $GeO_2$ layer on sidewalls of the source/drain regions and surfaces of the one or more fins, performing an anneal to form the inner oxide spacers from portions of the $GeO_2$ layer and the SiGe buffer liner disposed on sidewalls of the source/drain regions, and removing unreacted portions of the $GeO_2$ layer from the surfaces of the one or more fins.

The method may further comprise patterning one or more fin hard masks disposed over a top surface of the substrate, forming a dummy gate disposed over portions of the fin hard masks and the top surface of the first portion of the substrate, forming a dummy gate capping layer disposed over a top surface of the dummy gate, forming sidewall spacers on sidewalls of the dummy gate and the dummy gate capping layer, removing portions of the fin hard masks exposed by the dummy gate capping layer and the sidewall spacers, recessing the top surface of the substrate exposed by the dummy gate capping layer and the sidewall spacers to form the second portions of the substrate with the second height, forming the embedded source/drain regions on the exposed top surfaces of the second portions of the substrate, forming an interlevel dielectric layer disposed over the source/drain regions, removing the dummy gate capping layer, removing the dummy gate, etching the first portion of the substrate exposed by removal of the dummy gate to form the one or more fins disposed below the fin hard masks, forming an isolation layer disposed over the top surface of the first portion of the substrate surrounding a portion of sidewalls of the one or more fins, and removing the fin hard masks. Forming the gate stack may comprise forming a gate dielectric disposed on exposed surfaces of the sidewalls spacers, the interlevel dielectric layer, the inner oxide spacers, the fins and the isolation layer, forming a gate conductor disposed on the gate dielectric, and forming a gate capping layer disposed on a top surface of the gate conductor.

In some embodiments, a semiconductor structure comprises a substrate, embedded source/drain regions disposed over portions of a top surface of the substrate, one or more fins disposed over the top surface of the substrate between the embedded source/drain regions, the one or more fins providing channels for FinFETs, a gate stack disposed over the one or more fins, and inner oxide spacers disposed between the gate stack and the source/drain regions.

The one or more fins may comprise a first material with a first oxidation rate and the source/drain regions may comprise a second material with a second oxidation rate greater than the first oxidation rate, wherein the inner oxide spacers comprise thinned portions of an oxide layer disposed on sidewalls of the source/drain regions and surfaces of the one or more fins.

The FinFETs may comprise pFETs, the embedded source/drain regions may comprise SiGe, and the inner oxide spacers may comprise $SiO_2$ reacted from a $GeO_2$ layer disposed on sidewalls of the source/drain regions.

The FinFETS may comprise nFETS, the embedded source/drain regions may comprise Si:C, and the inner oxide spacers may comprise $SiO_2$ reacted from a SiGe buffer liner disposed on sidewalls of the source/drain regions and a $GeO_2$ layer disposed on the SiGe buffer liner.

The apparatus may further comprise an interlevel dielectric layer disposed over top surfaces of the source/drain regions, sidewall spacers disposed on sidewalls of the interlevel dielectric layer, and an isolation layer disposed over the top surface of the substrate surrounding at least a portion of sidewalls of the one or more fins. The gate stack may comprise a gate dielectric disposed over the isolation layer, the at least one fin, the inner oxide spacers and sidewalls of the sidewall spacers, a gate conductor disposed over the gate dielectric, and a gate capping layer disposed over a top surface of the gate conductor.

In some embodiments, an integrated circuit comprises one or more fin field-effect transistors (FinFETs) comprising a substrate, embedded source/drain regions disposed over portions of a top surface of the substrate, one or more fins disposed over the top surface of the substrate between the embedded source/drain regions, the one or more fins providing channels for the one or more FinFETs, a gate stack disposed over the one or more fins, and inner oxide spacers disposed between the gate stack and the source/drain regions.

The FinFETs may comprise pFETs, the embedded source/drain regions may comprise SiGe, and the inner oxide spacers may comprise $SiO_2$ reacted from a $GeO_2$ layer disposed on sidewalls of the source/drain regions.

The FinFETS may comprise nFETS, the embedded source/drain regions may comprise Si:C, and the inner oxide spacers may comprise $SiO_2$ reacted from a SiGe buffer liner disposed on sidewalls of the source/drain regions and a $GeO_2$ layer disposed on the SiGe buffer liner.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a substrate, the substrate comprising a first portion with a first height and second recessed portions with a second height less than the first height;
   forming embedded source/drain regions disposed over top surfaces of the second recessed portions of the substrate;
   forming one or more fins from a portion of the substrate disposed between the embedded source/drain regions, the one or more fins providing channels for fin field-effect transistors;
   forming a gate stack disposed over the one or more fins; and
   forming inner oxide spacers disposed between the gate stack and the source/drain regions;
   wherein the embedded source/drain regions comprise first portions adjacent the inner oxide spacers and second portions spaced apart from the inner oxide spacers by the first portions; and
   wherein the first portions of the embedded source/drain regions have a higher concentration of germanium than the second portions of the embedded source/drain regions.

2. The method of claim 1, wherein the fin field-effect transistors (FinFETs) comprise p-type FETs (pFETs) and the embedded source/drain regions comprise silicon germanium (SiGe).

3. The method of claim 2, wherein forming the inner oxide spacers comprises:
   depositing a germanium oxide ($GeO_2$) layer on sidewalls of the source/drain regions and surfaces of the one or more fins;
   performing an anneal to form the inner oxide spacers from portions of the $GeO_2$ layer and the source/drain regions; and
   removing unreacted portions of the $GeO_2$ layer from the surfaces of the one or more fins.

4. The method of claim 3, wherein the anneal comprises a spike anneal in nitrogen gas at about 700 degrees Celsius for a duration of about 30 seconds.

5. The method of claim 1, wherein the fin field-effect transistors (FinFETs) comprise n-type FETs (nFETs) and the embedded source/drain regions comprise carbon-doped silicon (Si:C).

6. The method of claim 5, wherein forming the inner oxide spacers comprises:
   depositing a SiGe buffer liner on sidewalls of the source/drain regions;
   depositing a germanium oxide ($GeO_2$) layer on sidewalls of the source/drain regions and surfaces of the one or more fins;
   performing an anneal to form the inner oxide spacers from portions of the $GeO_2$ layer and the SiGe buffer liner disposed on sidewalls of the source/drain regions; and
   removing unreacted portions of the $GeO_2$ layer from the surfaces of the one or more fins.

7. The method of claim 6, wherein the anneal comprises a spike anneal in nitrogen gas at about 700 degrees Celsius for a duration of about 30 seconds.

8. The method of claim 6, wherein the SiGe buffer liner has a thickness of about 3 nanometers.

9. The method of claim 1, further comprising:
   patterning one or more fin hard masks disposed over a top surface of the substrate;
   forming a dummy gate disposed over portions of the fin hard masks and the top surface of the first portion of the substrate;
   forming a dummy gate capping layer disposed over a top surface of the dummy gate; and
   forming sidewall spacers on sidewalls of the dummy gate and the dummy gate capping layer.

10. The method of claim 9, further comprising:
    removing portions of the fin hard masks exposed by the dummy gate capping layer and the sidewall spacers;
    recessing the top surface of the substrate exposed by the dummy gate capping layer and the sidewall spacers to form the second portions of the substrate with the second height;
    forming the embedded source/drain regions on the exposed top surfaces of the second portions of the substrate; and
    forming an interlevel dielectric layer disposed over the source/drain regions.

11. The method of claim 10, further comprising:
    removing the dummy gate capping layer;
    removing the dummy gate;
    etching the first portion of the substrate exposed by removal of the dummy gate to form the one or more fins disposed below the fin hard masks;
    forming an isolation layer disposed over the top surface of the first portion of the substrate surrounding a portion of sidewalls of the one or more fins; and
    removing the fin hard masks.

12. The method of claim 11, wherein forming the gate stack comprises:
forming a gate dielectric disposed on exposed surfaces of the sidewalls spacers, the interlevel dielectric layer, the inner oxide spacers, the fins and the isolation layer;
forming a gate conductor disposed on the gate dielectric; and
forming a gate capping layer disposed on a top surface of the gate conductor.

13. A semiconductor structure, comprising:
a substrate;
embedded source/drain regions disposed over portions of a top surface of the substrate;
one or more fins disposed over the top surface of the substrate between the embedded source/drain regions, the one or more fins providing channels for fin field-effect transistors;
a gate stack disposed over the one or more fins; and
inner oxide spacers disposed between the gate stack and the embedded source/drain regions;
wherein the embedded source/drain regions comprise first portions adjacent the inner oxide spacers and second portions spaced apart from the inner oxide spacers by the first portions; and
wherein the first portions of the embedded source/drain regions have a higher concentration of germanium than the second portions of the embedded source/drain regions.

14. The semiconductor structure of claim 13, wherein the fin field-effect transistors (FinFETs) comprise p-type FETs (pFETs) and the embedded source/drain regions comprise silicon germanium (SiGe), and wherein the inner oxide spacers comprise silicon dioxide ($SiO_2$) reacted from a germanium oxide ($GeO_2$) layer disposed on sidewalls of the source/drain regions.

15. The semiconductor structure of claim 13, wherein the fin field-effect transistors (FinFETs) comprise n-type FETs (nFETs) and the embedded source/drain regions comprise carbon-doped silicon (Si:C), and wherein the inner oxide spacers comprises silicon dioxide ($SiO_2$) reacted from a silicon germanium (SiGe) buffer liner disposed on sidewalls of the source/drain regions and a germanium oxide ($GeO_2$) layer disposed on the SiGe buffer liner.

16. The semiconductor structure of claim 13, further comprising:
an interlevel dielectric layer disposed over top surfaces of the source/drain regions;
sidewall spacers disposed on sidewalls of the interlevel dielectric layer; and
an isolation layer disposed over the top surface of the substrate surrounding at least a portion of sidewalls of the one or more fins;
wherein the gate stack comprises:
a gate dielectric disposed over the isolation layer, the at least one fin, the inner oxide spacers and sidewalls of the sidewall spacers;
a gate conductor disposed over the gate dielectric; and
a gate capping layer disposed over a top surface of the gate conductor.

17. An integrated circuit comprising:
one or more fin field-effect transistors comprising:
a substrate;
embedded source/drain regions disposed over portions of a top surface of the substrate;
one or more fins disposed over the top surface of the substrate between the embedded source/drain regions, the one or more fins providing channels for the one or more fin field-effect transistors;
a gate stack disposed over the one or more fins; and
inner oxide spacers disposed between the gate stack and the embedded source/drain regions;
wherein the embedded source/drain regions comprise first portions adjacent the inner oxide spacers and second portions spaced apart from the inner oxide spacers by the first portions; and
wherein the first portions of the embedded source/drain regions have a higher concentration of germanium than the second portions of the embedded source/drain regions.

18. The integrated circuit of claim 17, wherein the fin field-effect transistors (FinFETs) comprise p-type FETs (pFETs) and the embedded source/drain regions comprise silicon germanium (SiGe), and wherein the inner oxide spacers comprise silicon dioxide ($SiO_2$) reacted from a germanium oxide ($GeO_2$) layer disposed on sidewalls of the source/drain regions.

19. The integrated circuit of claim 17, wherein the fin field-effect transistors (FinFETs) comprise n-type FETs (nFETs) and the embedded source/drain regions comprise carbon-doped silicon (Si:C), and wherein the inner oxide spacers comprises silicon dioxide ($SiO_2$) reacted from a silicon germanium (SiGe) buffer liner disposed on sidewalls of the source/drain regions and a germanium oxide ($GeO_2$) layer disposed on the SiGe buffer liner.

20. The integrated circuit of claim 17, further comprising:
an interlevel dielectric layer disposed over top surfaces of the source/drain regions;
sidewall spacers disposed on sidewalls of the interlevel dielectric layer; and
an isolation layer disposed over the top surface of the substrate surrounding at least a portion of sidewalls of the one or more fins;
wherein the gate stack comprises:
a gate dielectric disposed over the isolation layer, the at least one fin, the inner oxide spacers and sidewalls of the sidewall spacers;
a gate conductor disposed over the gate dielectric; and
a gate capping layer disposed over a top surface of the gate conductor.

* * * * *